United States Patent
Ulrich et al.

(10) Patent No.: US 8,110,296 B2
(45) Date of Patent: Feb. 7, 2012

(54) MULTIFUNCTIONAL HARD MATERIAL COATING

(75) Inventors: Sven Ulrich, Stutensee-Blankenloch (DE); Michael Stüber, Landau (DE); Harald Leiste, Weingarten (DE); Helmut Holleck, Kalsruhe (DE)

(73) Assignee: Forschungszentrum Karlsruhe GmbH, Karlsruhe (DE)

( * ) Notice: Subject to any disclaimer, the term of this patent is extended or adjusted under 35 U.S.C. 154(b) by 400 days.

(21) Appl. No.: 12/221,690

(22) Filed: Aug. 6, 2008

(65) Prior Publication Data

US 2009/0061156 A1    Mar. 5, 2009

Related U.S. Application Data

(63) Continuation-in-part of application No. PCT/EP2007/003577, filed on Apr. 24, 2007.

(30) Foreign Application Priority Data

Apr. 28, 2006   (DE) .................. 10 2006 019 866

(51) Int. Cl.
*B32B 9/00*    (2006.01)
(52) U.S. Cl. ........ 428/697; 428/325; 428/698; 428/699; 428/701
(58) Field of Classification Search .................. 428/325, 428/697, 698, 699, 701
See application file for complete search history.

(56) References Cited

U.S. PATENT DOCUMENTS 7,060,345 B2 *  6/2006  Fukui et al. ................... 428/697

FOREIGN PATENT DOCUMENTS

| JP | 62 207869 | | 9/1987 |
| JP | 2001-121314 | * | 5/2001 |
| JP | 2004-114219 | * | 4/2004 |

OTHER PUBLICATIONS

Shalaeva et al "Metastable phse diagram of Ti—S—N(O) films (CSi < 30 at.%)" Thin Solid Films (1999) p. 129-136.*
Kuznetsov et al "Metastable TiSixNyOz films of B1-type structure prepared by the arc process" Thin Solid Films (1996) p. 75-81.*
Ding et al "Structure and mechanical properties of Ti—Si—N films deposited by combinined DC/RF reactive unbalanced magnetron sputtering" J. Vac. Technol. A 22(6) 2004 p. 2351-2355.*
Vrepek et al., "Degradation of Superhard Nanocomposites by Built-In Impurities" , Jurnal of Vacuum Science & Technology B: mciroelectronics Processing and Phenomena, American Vacuum Society , NY, NY vol. 22, No. 2, Mar. 2004 pp. L5-L9.
Shtansky, et al., "AMultifunctional Ti—(Ca,Cr)—(C,N,O,P) films for load-bearing implants". Biomaterials, Elsevier Science Publishers, vol. 27, No. 19, pp. 3519-3531, Mar. 2006.

* cited by examiner

*Primary Examiner* — Archene Turner
(74) *Attorney, Agent, or Firm* — Klaus J. Bach

(57) ABSTRACT

In a multi-functional hard material coating of a substrate wherein the hard material coating comprises a single phase crystalline structure including metastable mixed crystals of at least two hard material components which are not soluble in each other and comprise at least one metallic hard material and an ionic hard material whereby the advantages of metallic and ionic hard material components are combined.

9 Claims, 3 Drawing Sheets

MULTIFUNCTIONAL HARD MATERIAL COATING

This is a Continuation-In-Part Application of pending International PCT/EP2007/003577 filed Apr. 24, 2007 and claiming the priority of German application 10 2006 019 866.2 filed Apr. 28, 2006.

BACKGROUND OF THE INVENTION

The invention relates to a multifunctional hard material coating of a substrate which hard material coating comprises a single-phase crystalline structure.

Hard materials are divided into metallic, covalent or ionic hard materials. Each of these three hard material groups has specific advantages and disadvantages. The metallic hard materials such as the transition metal nitrides and the transition metal carbides are generally the hard materials with the highest toughness and the best attachment capability to a metallic substrate. The covalent hard materials such as diamond, cubic boron nitride, boron carbide, silicon carbide or aluminum nitride excel with regard to all the other hard materials by their high hardness and heat hardness. The oxidic hard materials to which also silicon oxide belongs have the best chemical stability and the lowest tendencies for surface reactions or interactions.

It is the object of the present invention to provide a hard material coating which has the advantages of metallic and ionic hard metal coatings.

SUMMARY OF THE INVENTION

In a multi-functional hard material coating of a substrate wherein the hard material coating comprises a single phase crystalline structure including metastable mixed crystals of at least two hard material components which are not soluble in each other and comprise at least one metallic hard material and an ionic hard material whereby the advantages of metallic and ionic hard material components are combined.

The basic concept of the invention resides in the establishment on a substrate of a hard material coating which preferably has a nanocrystalline single phase structure preferably of an average grain size below 200 nm and consists of a meta stable mixed-crystal or solid solution of two material components which are not dissoluble one in the other and therefore, in principle, can not be alloyed. The material components herein comprise at least one metallic and one ionic hard material. Preferably, the material components are formed from the quasi-binary system out of a cubic face-centered hard material and an oxide ceramic, wherein the cubic face-centered hard material is preferably a carbide or nitride of a transition metal and the oxide ceramic is based on Si or Zr.

Such mixed crystals are formed only under synthesis conditions in which extremely high quenching rates (1013 K/s) can be obtained as it is possible for example with PVD- and PECVD-procedures. However, if the quenching rate is too high, an amorphous structure or an amorphous structure with crystalline enclosures is formed and if the quenching rate is too low an increased amount of composite (crystal mixture) is formed because of the longer time available for the diffusion of the atoms/molecules. It is pointed out however that neither of these three modifications is the aim of the present invention. It is noted that it is the mixed crystals which have the advantageous properties of the metallic hard materials such as toughness and good adherence to substrates together with those of the ionic hard materials such as chemical stability and high temperature stability particularly in an oxygen containing environment.

As substrate materials basically all materials are suitable that can withstand the required processing steps (high temperatures, vacuum) such as for example, metals, hard metals, cermets, alloys, glass, ceramics or certain polymers. Before the actual coating process, the substrate surface is treated preferably by grinding, polishing and/or cleaning of the substrate.

The coating layer thicknesses are preferably between 1 and 10 μm and are controlled by the coating time.

The basic concept resides in replacing a number of atoms of the dominating grating structure of a material component by atoms or molecules of another material component. For example, the metal atoms, particularly silicon Si, aluminum Al or zirconium Zr occupy in a cubic face-centered grating of a carbide or nitride of a transition metal such as titanium Ti, niobium Nb or basically any other element with an atomic number of 21 to 30, 39 to 48 or 57 to 80, a number of grating locations whereas a number of nitrogen atom N or carbon atoms C are replaced at their grating locations by oxygen O.

The synthesis of these nano-crystalline mixed crystals is very important. With a preferably reactive or with a non-reactive PVD procedure (Physical Vapor Deposition), the individual material components are formed from at least one metal reservoir.

With a non-reactive PDV-procedure, the material components, for example, of a sputter cathode are transferred simultaneously into the gas- and/or plasma phase and condense directly on a substrate surface as the components of a hard metal layer.

Alternatively, in a reactive PDV process, a part of the elements atomized from a cathode may react in a plasma with a reactive gas to form molecules.

In each case, different material components are formed which are installed as elements or molecules into the mixed crystals which, as a result, become meta-stable. In this way, preferably a very fine grain structure is formed (grain size below 200 nm).

With the precipitation out of the gas phase extremely high quenching rates of up to $10^{13}$ K/s can be reached on the substrate surface which favors the formation of a nanocrystalline structure of a meta-stable mixed crystal with grain limits with preferred grain sizes (crystallite sizes) below 1 μm, preferably below 200 nm, further preferably between 1 and 50 nm or 1 and 10 nm. The high quenching rate prevents furthermore, the occurrence of substantial diffusion processes and, consequently, the undesirable segregation in the metastable mixed crystal in a micro-scale. The process can be optimized by an additional tempering of the substrate, preferably by way of a substrate carrier which can be tempered to a temperature of 1 to 1000° C., preferably 20 to 700° C.

Generally, particularly nano-crystalline, silicon-based meta-stable multi-functional oxydic hard material layers can be optimized wherein the properties of the metallic and of the ionic (oxydic) material components can be adjusted and prominently emphasized. Using those thin layer materials, tools and construction components can be coated with a protective or a functional layer. Compared with the conventional hard material layers such as titanium nitride, chromium nitride, titanium aluminum nitride, these thin-layer materials are characterized by additionally providing oxidation and high-temperature stability as well as a substantially reduced surface reaction with regard to liquids (coolants and lubricants) and components with which they are in contact.

The synthesis of nanocrystalline silicon-based, metastable, multifunctional oxydic hard material layers can be realized for example by all PVD and/or PECVD processes (PVD: Physical Vapor Depostion, PECVD: Plasma Enhanced Chemical Vapor Deposition) upon appropriate selection of the synthesis condition.

Below, advantageous embodiments of the invention will be described in greater detail with reference to the accompanying drawings.

BRIEF DESCRIPTION OF THE DRAWINGS

FIG. 2a is light field photo, FIG. 2b is a dark field photo and FIG. 2c is a diffraction photo, FIG. 3a is a light field photo, FIG. 3b dark field photo, FIG. 3c is a diffraction photo.

DESCRIPTION OF ADVANTAGEOUS EMBODIMENTS

Figure 1:
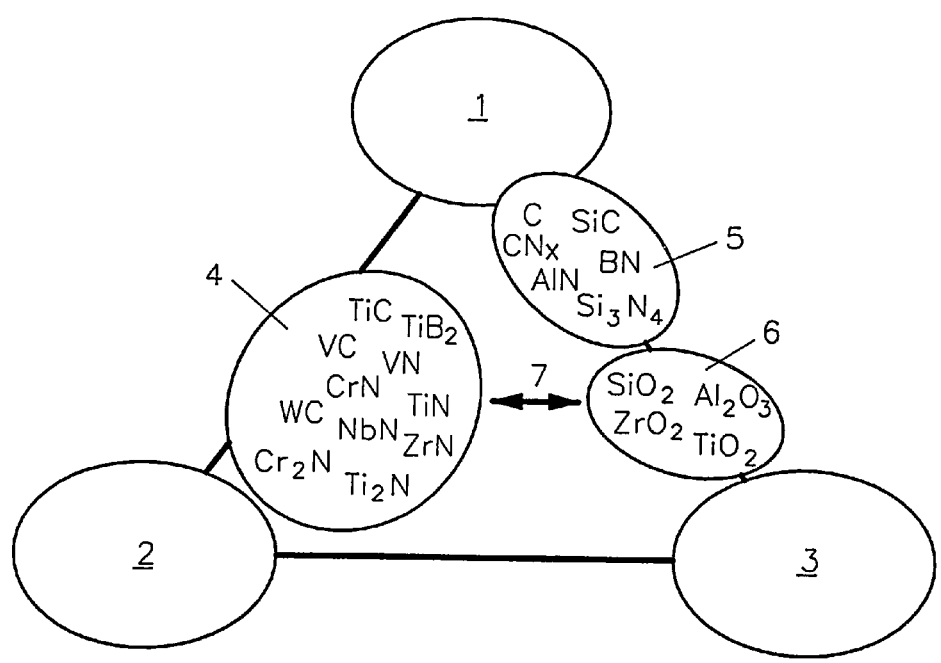
FIG. 1 is a graphic illustration of the division of hard materials into metallic, covalent and ionic hard materials.

FIG. 1 is a graphic illustration of the classification of hard materials as mentioned in the introductory part. Basically, three types of bonds are important in connection with hard materials, namely the covalent bond the metallic bond 2 and the ionic bond 3. The types of bonds are presented in a triangle into which the three groups of hard materials mentioned earlier can be accommodated. In accordance with their main types of bonds, the separate areas in which the metallic hard materials, 4, the covalent hard materials 5 (non-oxide ceramics) and ionic hard materials 6 (oxydic ceramics) are located. The multifunctional hard material coating sought in connection with the present invention comprising for example nanocrystalline, metastable, cubic-face centered, multifunctional titanium-silicon oxy nitride as well as titanium silicon oxycarbide is located in the range 7 between the metallic and the ionic hard materials.

In following embodiments 1 and 2, two material systems are described as examples, namely nanocrystalline, metastable, cubic face centered multifunctional titanium silicon oxynitride and titanium silicon oxycarbide.

In both exemplary embodiments, the hard material layers are produced by high frequency magnetron atomization in an argon plasma of a composite target which has the desired composition and provides the respective atoms for growing the layer on a substrate. In the embodiment 1, these are, for example, 40 at % titanium 40 at % nitrogen, 5 at % silicon and 5 at % oxygen. Depending on the synthesis conditions, the following constitutions are formed:

a) an amorphous titanium-silicon oxygen network,
b) a nano-crystalline, cubic face-centered titanium nitride in an amorphous matrix, which is composed of silicon and oxygen atoms,
c) the desired single-phase nano-crystalline, metastable, cubic face-centered (Ti, Si) (N,O)-structure, and
d) a nano-composite consisting of two crystalline phases: titanium nitride and silicon oxide.

The single phase nanocrystalline, metastable cubic-face-centered (Ti, Si) (N,O) structure described under (c) is, based on its structure, comparable with the cubic face-centered titanium-nitride structure but, weighted according to the atomic composition at the titanium locations, there are also silicon atoms, and on the nitrogen locations, there are also oxygen atoms. The constitutions (a) to (d) may also be formed in a desired way by the synthesis conditions. With increasing diffusion length of the layer-forming particles (here 40 at % titanium, 40 at % nitrogen, 5 at % silicon and 5 at % oxygen), the constitutions a) to d) can be established during the synthesis process one after the other. The diffusion length of the particles forming the hard material coating increases with the substrate temperature and with the energy and impulse input of the ion bombardment. The synthesis conditions as selected in the exemplary embodiments make the formation of the constitution c) possible.

The hard material coatings had for example an arithmetic mean roughness value Ra of 3 nm to 23 nm, a smoothing depth Rp of 16 nm to 200 nm, a squared mean roughness value Rq of 6 nm to 27 nm, a difference Rt between the highest projection and the lowest groove of 29 nm to 170 nm and an average roughness depth $R_{z(iso)}$ of 20 nm to 190 nm.

Example 1

Synthesis Example of Nanocrystalline, Cubic Face-Centered (Ti,Si) (N, O)

The silicon and hard metal substrates were cleaned each time for 15 minutes in an acetone and then in an ultrasound bath including isopropanol. Before the actual coating, the substrates were plasma-etched. The hard material was deposited by means of non-reactive high frequency magnetron atomization of a Ti—Si—N—O composite target (composition: TiN:SiO=90:10 diameter: 75 mm) with a target power of 300 W in a pure argon plasma at a pressure of 0.15 Pa. The substrate temperature was 600° C. and the substrate bias was −50V.

The nano-crystalline cubic face-centered structure could be proved by x-ray diffraction examinations using copper Kα radiation (see table 1). From the x-ray diffraction signal at 2Θ=60.91° with a half width of 1.24°, a grating parameter of 4.3 Å could be calculated taking the widening of the apparatus into consideration and, using the Deby-Scherrer-formula, a crystallite-size of about 9 nm could be estimated.

TABLE 1

Calculated grating constant, grating parameter and crystallite size from the position and the half width [width at half of maximum intensity) of the x-ray fraction signal for the cubic face-centered (Ti, Si) (N, O) layer.

| SiO Content in Mol % | Signal position in ° | Half Width in ° | Grating constant in Å | Grating Parameter in Å | Crystallite size in nm |
|---|---|---|---|---|---|
| 10 | 60.91 | 1.29 | 1.52 | 4.30 | 9.28 |

Figure 2A:
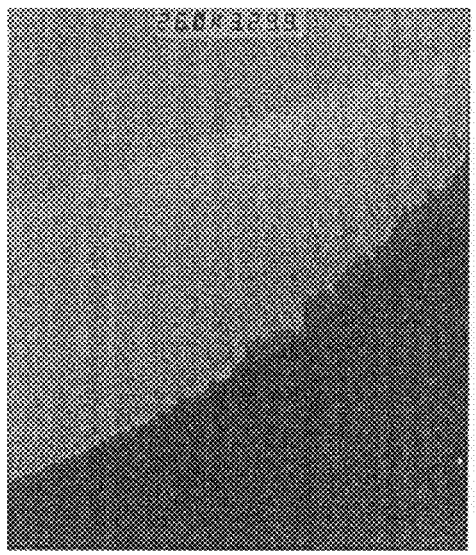
FIGS. 2a, 2b, and 2c show TEM photographs of the cubic face-centered (Ti, Si) (N, O) layer.

Supplemental to the x-ray diffraction analyses also electron diffraction examinations were performed. FIG. 2a shows a light field photo of the $(Ti_{0.9}, Si_{0.1})(N_{0.9},O_{0.1})$ layer, which was taken with a 26000 fold magnification. The medium grey area in the upper part of the FIG. 2a shows the substrate. Adjacent the black area, the individual crystals can be recognized. In the lower part of the picture, there is no substitute. In this border area, the dark areas show the crystallites. It is apparent from this photo that the crystals grow normal to the substrate surface.

Figure 2B:
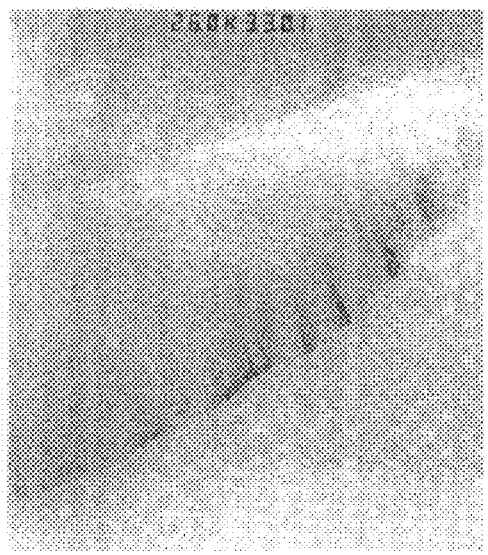

The dark field photo which has the same magnification as the light field photo (FIG. 2b) is obtained when a section of the first diffraction ring is photographed. Here, the crystalline area is dark. In this photo, the crystals are visible which have caused the reflexes in the diffraction image. On the photo, the crystallites have a length of between 110 nm and 380 nm and a width of 450 nm to 750 nm.

Figure 2C:
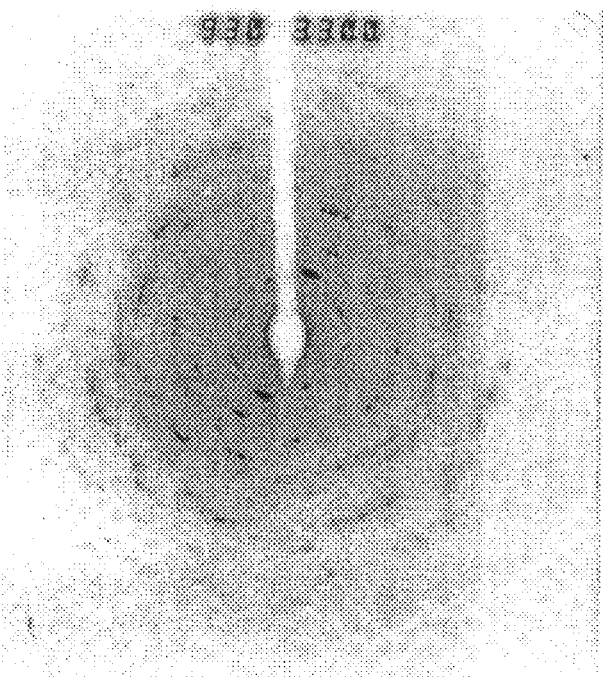

In the diffraction photo (FIG. 2c) several radii are visible on which several dark spots (reflexes) are present. From these radii, the grating constants of the layer can be determined, the crystal type can be determined and the grating parameter can be calculated. The crystal structure is the cubic face-centered (Ti, Si) (N,O)-grating with a grating parameter of 4.3 Å.

The nano-crystalline metastable, multi-functional cubic face-centered (Ti,SI) (N,O)-layer exhibits excellent mechanical properties. Because of the double mixed-crystal strengthening of the grating, the layer hardness is 3100 HV and the reduced E-module is 520 GPa. The critical load for the failure in the scratch test is at about 38N which indicates a good adhesion strength. The adhesion strength can further be increased by an adhesion-generating layer of for example titanium nitrite (TiN).

Example 2

Synthesis Example of a Nanocrystalline, Metastable Cubic Face-Centered (Ti,Si)(C,O)

The silicon- and hard-metal substrates were cleaned for 15 min each in an acetone- and than in an isopropanol ultrasound bath. Before the actual coating, the substrates were plasma etched. The coating was deposited by non-reactive high, frequency magnetron atomization of a Ti—Si—C—O composite target (composition: TiC:SiO=80:20, diameter: 75 mm) with a target power of 300 W in a pure argon plasma at a pressure of 0.15 PA. The substrate temperature was 600° C. and the substrate bias was 50 V.

The nano-crystalline cubic face-centered structure could be proved by x-ray diffraction examinations using copper Kα-radiation (see table 2). From the x-ray diffraction signal with 2Θ=60.96° with a half width of 2.65°, a grating parameter of 4.33 Å could be calculated taking into consideration the widening of the apparatus and using the Debye-Scherrer formula a crystallite size of about 4 nm could be estimated.

TABLE 2

The calculated grating parameter and the crystal size based on the position and the half width of the x-ray diffraction signal for the cubic face-centered (Ti, Si) (C, O).

| SiO Content in Mol % | Signal position in ° | Half Width in ° | Grating constant in Å | Grating Parameter in Å | Crystallite size in nm |
|---|---|---|---|---|---|
| 20 | 60.46 | 2.65 | 1.53 | 4.33 | 3.83 |

Figure 3A:
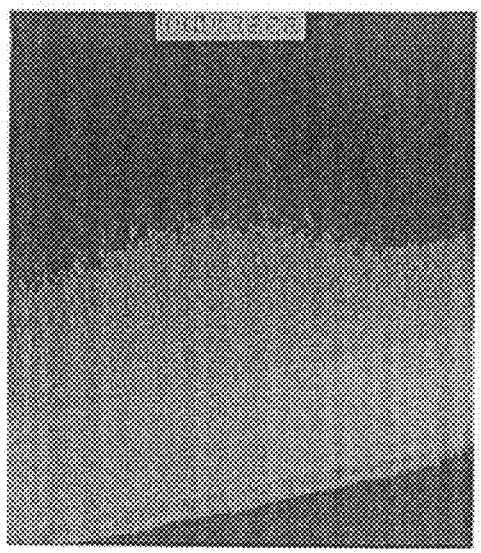
FIGS. 3a to 3c show TEM photographs of the cubic face-centered (Ti, SI) (C,O)-layer.

In addition to the x-ray diffraction analyses also election diffraction examinations were performed. FIG. 3a shows a light field photo of the $(Ti_{0.8}, SiO_{0.2})(C_{0.8}, O_{0.2})$-layer, which was photographed with a 44000 fold amplification. The medium grey area in the upper part of the image represents the substrate. Toward the black area, the individual crystals can be seen. In the lower area of the image, there is no substrate. In this border area, the dark areas represent the crystallites. From this image, it can be recognized that the crystals extend perpendicularly to the substrate surface.

Figure 3B:
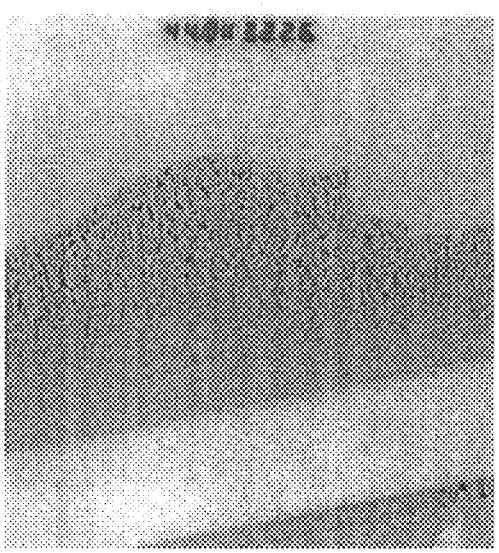

The dark field photo which has the same amplification as the light field photo (FIG. 3b is obtained when a section of the first diffraction ring is photographed. Herein, the crystalline areas are dark. In this picture, the crystals which have caused the reflection in the refraction image are visible. In the image, the crystallites have a length between 20 nm and 90 nm and a width of about 350 nm.

Figure 3C:
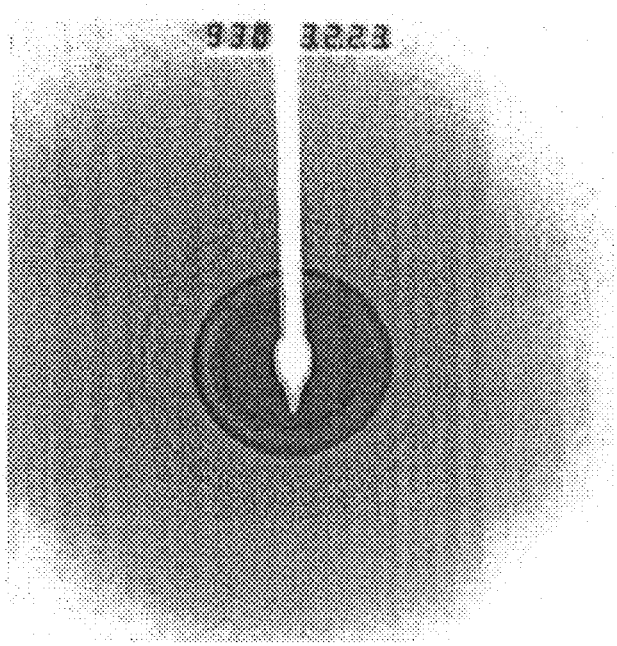

In the diffraction photo (FIG. 3c), several infraction rings are visible. From the radii, the grading constants of the layers can be determined, the crystal type can be determined and the grating parameter can be calculated. The crystal structure is formed by the cubic face-centered (Ti, Si) (C,O) grating with a grating parameter of 4.33 Å.

The nanocrystalline, metastable, multifunctional cubic face-centered (Ti,Si) (C,O)-layer exhibits excellent mechanical properties. Because of the double mixed crystal strengthening of the grating the layer hardness is 4200 HV and the E-module is reduced to 620 GPa. Consequently, the material has a superior hardness. (hardness>4000 HV). The critical load for the failure in the scratch-test is at about 23 N, which indicates a sufficiently high adhesive strength. The adhesive strength can be further increased by an adhesion generating layer for example of titanium carbide TiC.

What is claimed is:

1. A multi-functional hard material coating of a substrate, said hard material coating comprising a single phase crystalline structure including metastable mixed crystals consisting of two material components which are not soluble in each other, and which comprise at least one metallic hard material component (4) and one ionic hard material component (6).

2. The hard material coating according to claim 1, wherein the material components are formed from a quasi binary system comprising a cubic face-centered hard material and an oxide ceramic.

3. The hard material coating according to claim 2, wherein the cubic face-centered hard material is a carbide or a nitride of a transition metal and the oxide ceramic is based on Si or Zr.

4. The hard material coating according to claim 3, wherein the transition metal is Ti.

5. The hard material coating according to claim 1, wherein the hard material coating has a medium particle size of between 1 and 200 nm.

6. The hard material coating according to claim 5, wherein the substrate includes tempering means.

7. The hard material coating according to claim 6, wherein the tempering means comprises a substrate carrier which can be temperature-controlled.

8. The hard material coating according to claim 1, wherein the substrate has a surface consisting of at least one of a metal, a hard metal, a cermet, an alloy, glass, ceramics and a polymer.

9. The hard material coating according to claim 1, wherein the coating has an arithmetic mean roughness Ra of 3 nm to 23 nm, a smoothness depth $R_p$ of 16 nm to 200 nm, a squared medium roughness value $R_q$ of 6 nm to 27 nm, a difference $R_t$ between the highest peak and the deepest groove of 29 nm to 170 nm and an average roughness depth $R_{z(130)}$ of 20 nm to 190 nm.

* * * * *